US008610433B2

(12) United States Patent
Dannels et al.

(10) Patent No.: US 8,610,433 B2
(45) Date of Patent: Dec. 17, 2013

(54) PULSED ASL USING TAGGING PULSE PATTERN ENCODING/DECODING OF FLOWING NUCLEI COHORTS

(75) Inventors: Wayne R. Dannels, Mentor, OH (US); Andrew J. Wheaton, Shaker Heights, OH (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 404 days.

(21) Appl. No.: 13/112,291

(22) Filed: May 20, 2011

(65) Prior Publication Data

US 2012/0293171 A1    Nov. 22, 2012

(51) Int. Cl.
*G01V 3/00*   (2006.01)

(52) U.S. Cl.
USPC .......................................... 324/309; 324/307

(58) Field of Classification Search
USPC ........ 324/300–322; 600/407–445; 128/653.3; 424/1.49
See application file for complete search history.

(56) References Cited

U.S. PATENT DOCUMENTS

| 6,564,080 B1* | 5/2003 | Kimura .......................... 600/410 |
| 2008/0269595 A1 | 10/2008 | Wong | |
| 2010/0003189 A1* | 1/2010 | Tlsty et al. .................... 424/1.49 |
| 2012/0003639 A1* | 1/2012 | Kerlikowske et al. ........ 435/6.11 |
| 2012/0157824 A1* | 6/2012 | Bossmann et al. ............ 600/420 |
| 2013/0154643 A1* | 6/2013 | Kalechofsky ................. 324/309 |

OTHER PUBLICATIONS

Guenther, "Highly efficient accelerated acquisition of perfusion inflow series by Cycled Arterial Spin Labeling," *Proc. Intl. Soc. Mag. Reson. Med.*, vol. 15 p. 380 (2007).
Wells, et al., "In Vivo Hadamard Encoded Continuous Arterial Spin Labeling (H-CASL)," *Mag. Res. Med.*, vol. 63, pp. 1111-1118 (2010).
Panasci, et al., "Case Report: Non-Contrast-Enhanced Evaluation of Perfusion Deficiencies of the Brain," *Magnetom Flash*, Issue 1, pp. 16-19 (2010).
Robson, et al., "Time-resolved Vessel-selective Digital Subtraction MR Angiography of the Cerebral Vasculature with Arterial Spin labeling," *Radiology*, vol. 257, No. 2 , pp. 507-515 (2010).

* cited by examiner

*Primary Examiner* — Brij Shrivastav
(74) *Attorney, Agent, or Firm* — Nixon & Vanderhye PC

(57) ABSTRACT

Magnetic resonance imaging (MRI) produces an image representative of flowing nuclei within a subject. For each of plural MRI data acquisition sequences, a non-contrast pulsed ASL (arterial spin labeling) pre-sequence is applied to flowing nuclei in a tagging region during a tagging period (that occurs prior to MRI data acquisition from a selected downstream image region). The ASL pre-sequence includes plural different elapsed tagging times at which a radio frequency (RF) nuclear magnetic resonant (NMR) nutation tagging pulse occurs or does not occur in accordance with different predetermined patterns for corresponding different data acquisition sequences. Acquired MRI data is decoded in accordance with such predetermined patterns to detect MRI signals emanating from different cohorts of flowing nuclei that have been subjected to different combinations of nutation pulses. Acquired MRI data is used to reconstruct at least one image representing flowing nuclei within the selected image region.

20 Claims, 9 Drawing Sheets

US 8,610,433 B2

PULSED ASL USING TAGGING PULSE PATTERN ENCODING/DECODING OF FLOWING NUCLEI COHORTS

FIELD

The subject matter below relates generally to magnetic resonance imaging (MRI) processes. Preferably, the MRI processes described below involve enhancements to arterial spin labeling (ASL) MRI for imaging flowing nuclei such as blood within patient vasculature.

DETAILED DESCRIPTION

Figure 1:
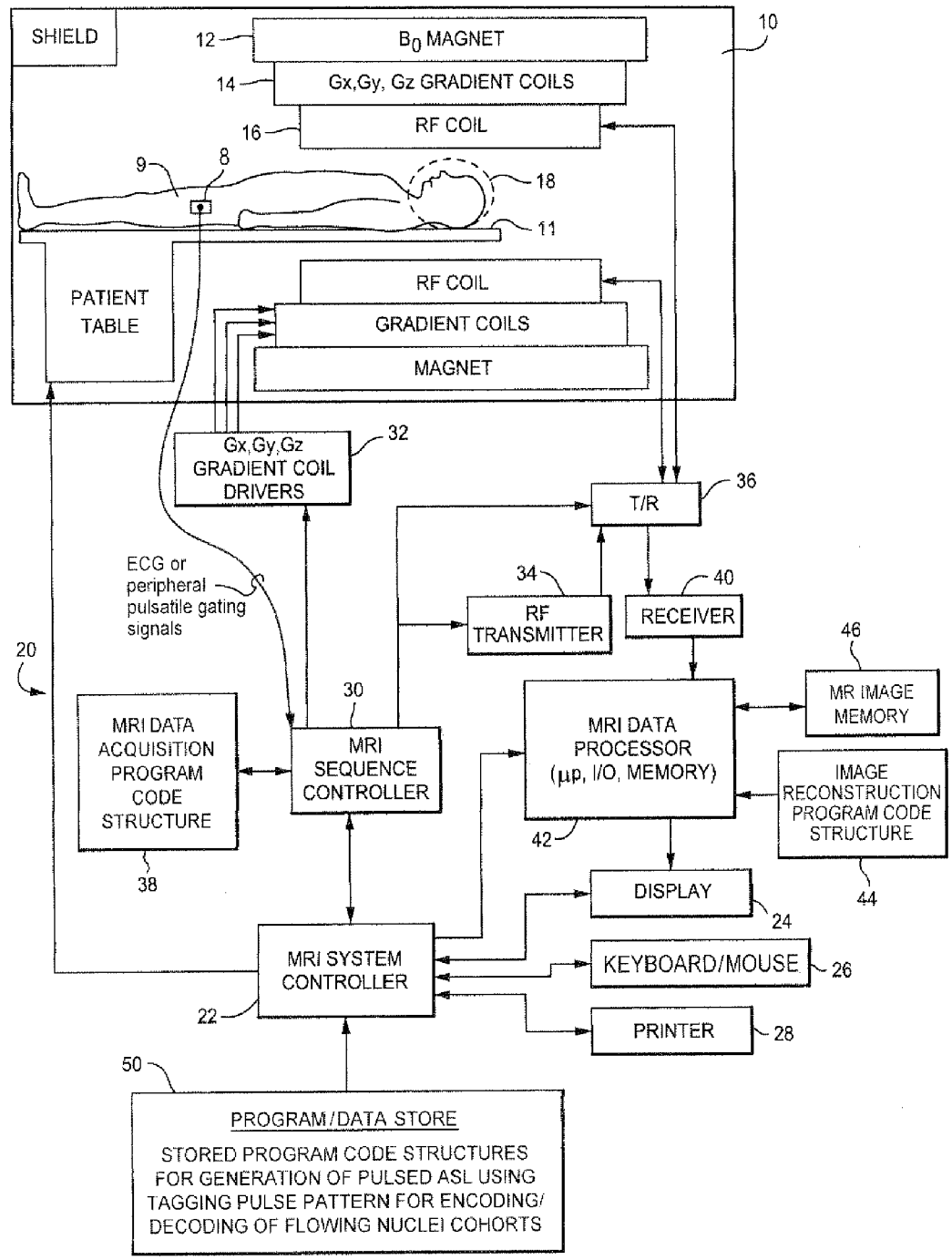
FIG. 1 is a high-level schematic block diagram of an exemplary MRI system embodiment adapted to acquire and process data for pulsed ASL MRI using tagging pulse pattern encoding/decoding of flowing nuclei cohorts.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a $G_x$, $G_y$, and $G_z$ gradient coil set 14 and an RF coil assembly 16. Along the horizontal axis of this cylindrical array of elements is an imaging volume 18 shown as substantially encompassing the head of a patient 9 supported by a patient bed or table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as RF transmitter 34 and transmit/receive switch 36 (if the same RF coil is used for both transmission and reception). As those skilled in the art will appreciate, one or more suitable physiological transducers 8 may be affixed to the patient's body to provide ECG (electrocardiogram) and/or peripheral pulsatile gating signals to the MRI sequence controller 30. The MRI sequence controller 30 also has access to suitable program code structure 38 for implementing MRI data acquisition sequences already available in the repertoire of the MRI sequence controller 30—e.g., to generate non-contrast MRA (magnetic resonance angiography) and/or MRV (magnetic resonance venography) and/or blood perfusion into tissue images using operator and/or system inputs defining particular MRI data acquisition sequence parameters.

The MRI system 20 includes an RF receiver 40 providing input to data processor 42 so as to create processed image data which may be sent to display 24. The MRI data processor 42 is also configured for access to image reconstruction program code structure 44 and to MR (magnetic resonance) image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for generation of pulsed ASL using tagging pulse pattern for encoding/decoding of flowing nuclei cohorts to provide non-contrast MRI, operator inputs to same, etc.) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MET system controller 22).

Indeed, as those skilled in the art will appreciate, the FIG. 1 depiction is a very high-level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR-imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real world physical events and conditions (e.g., the tissues of a patient over an imaged volume space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to acquire and/or process MRI data acquisitions and/or to generate and display MR images.

Figure 2:
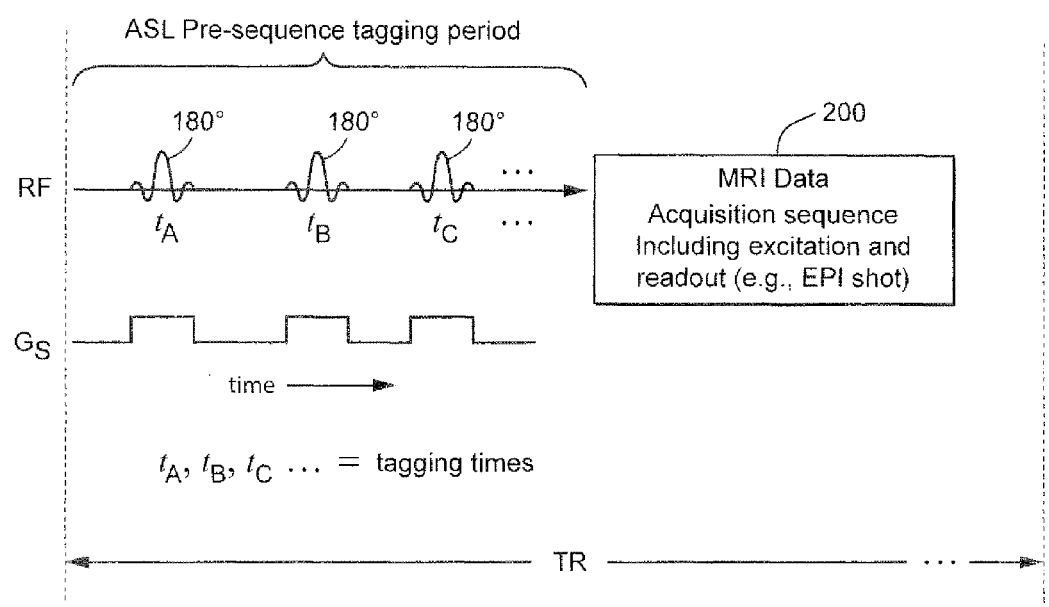
FIG. 2 is a schematic depiction of an exemplary "one shot" MRI data acquisition sequence to be repeated over multiple repetition times TR used to acquire tagged ASL image data.

In the exemplary embodiment of FIG. 2, a "one shot" MRI data acquisition sequence over a repetition interval TR is repeated plural TR times. For each "one shot" instance, the data acquisition sequence includes an ASL pre-sequence tagging period, wherein different slice-specific RF tagging pulses are imposed, or not imposed, at successive elapsed tagging times tA, tB, tC, etc. In this exemplary embodiment, the tagging pulses are 180° nutation inversion pulses. To make them effective within a specific selected tagging volume (e.g., a "slice" volume from patient tissue located upstream of a desired selected image region), slice-selective gradient $G_s$ is imposed concurrently with each imposed tagging RF pulse.

After having imposed a particular pattern of on/off tagging pulses during the tagging period (sometimes referred to as the inversion time TI), then any desired "read-out" MRI data acquisition sequence 200 is imposed including at least one RF excitation pulse, suitable gradient pulses and a read-out interval for actually acquiring MRI RF responses from the excited nuclei within a selected downstream image region. For example, in the exemplary embodiment, the MRI data acquisition sequence may be a "one shot" (i.e., employing only a single excitation pulse) EPI (echo planar imaging) sequence of a type that is well known in the art. It will be appreciated that such non-contrast imaging of patient vasculature/perfusion is often preferred since it avoids the use of possibly hazardous, inconvenient and inefficient administration of contrast agents into the patient, timing imaging sequences with respect to the movement of a bolus of such contrast agent within patient tissues, etc.

FIGS. 3A-3D schematically represent various cohorts of NMR nuclei subjected to RF tagging pulses within the selected tagging region as simple circles or spheres. However, as those skilled in the art will appreciate, in the real world, all NMR nuclei within the selected tagging region are subjected to a tagging pulse at a given tagging time tA-tD (if there was, in fact, a tagging pulse generated at that potential tagging time). Thus, each cohort of nuclei actually includes all NMR nuclei that happen to be present in the selected tagging region (e.g., a slice or slab volume) at a given tagging pulse time when a tagging pulse may (or may not) occur. Accordingly, a single cohort is the collection of nuclei which are identically present in the tagging region for some subset of the tagging times (whether or not a tagging pulse actually occurs at each such tagging time).

Figure 3A:
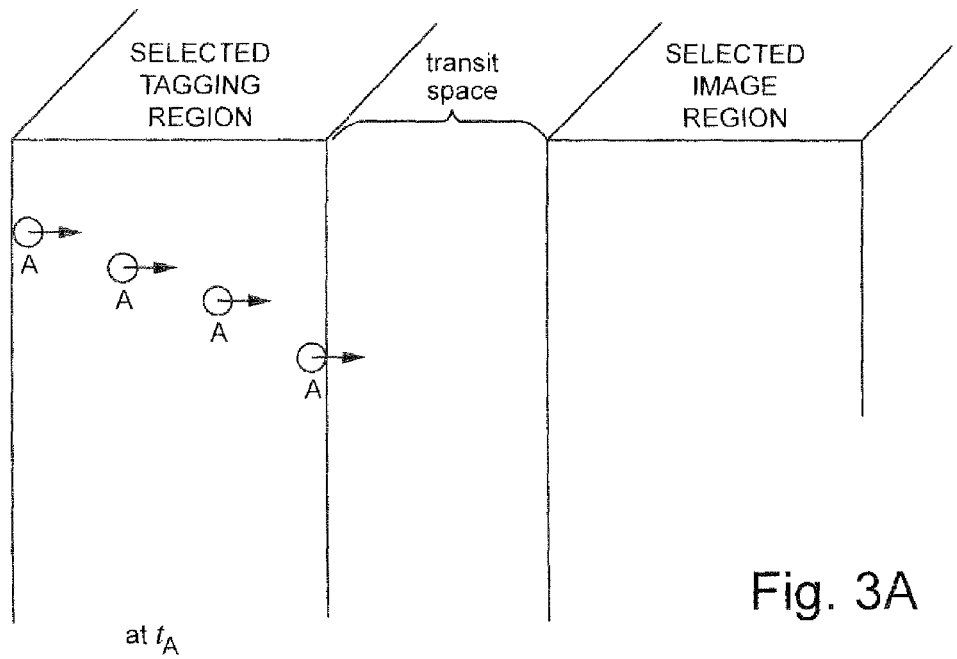
FIGS. 3A-3D are schematic diagrams at successive tagging times tA-tD illustrating different respectively tagged cohorts of NMR nuclei flowing from a selected tagging region through a transit space towards a selected image region.
Figure 3B:
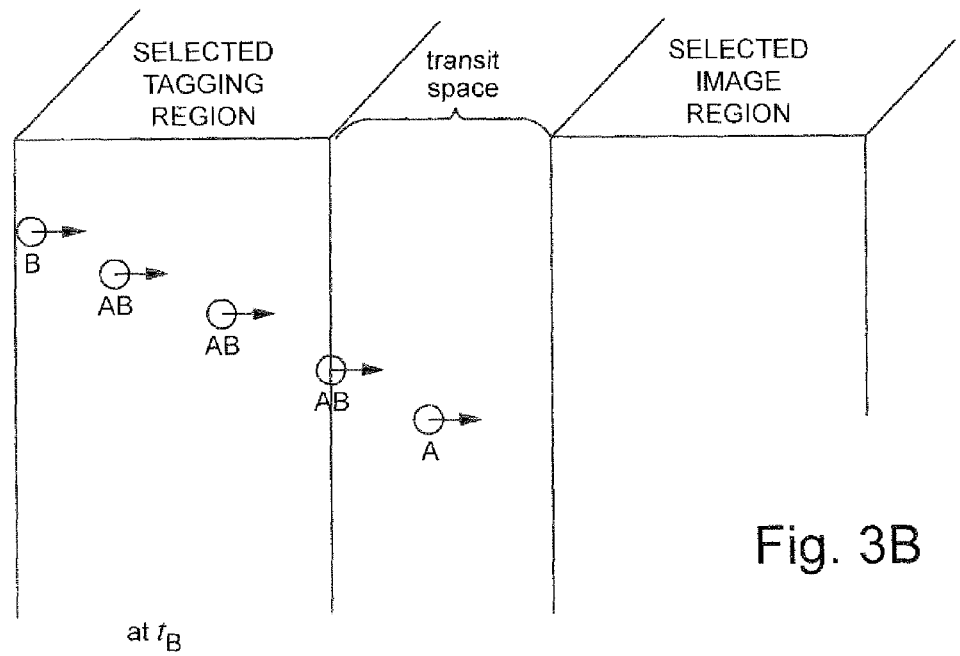

In any event, for purposes of illustration, FIG. 3A identifies four groupings of nuclei within cohort A that are moving towards the right so as to eventually pass through a transit space and into a selected image region. If the pre-pulse scheme had only a single tagging time tA, then all of these nuclei are actually part of the same cohort A and all have been subjected to a tagging pulse at tagging time tA.

Next, consider effects associated with a second tagging time tB. At subsequent tagging time tB, depicted in FIG. 3B, it will be seen that one of the subsets of nuclei within cohort A has now moved out of the selected tagging region—while a new group of nuclei has moved into the selected tagging region at time tB. Thus, there are now some nuclei located within the transit space that have only been subjected to a tagging pulse A, while others still located within the tagging region have been subjected to both tagging pulses A and B and yet others have been subjected only to tagging pulse B. Accordingly, at this moment, there are at least three cohorts of NMR nuclei A, AB and B that have been defined by their flow rate and spatial positions with respect to their entrance to and exit from the selected tagging region.

Figure 3C:
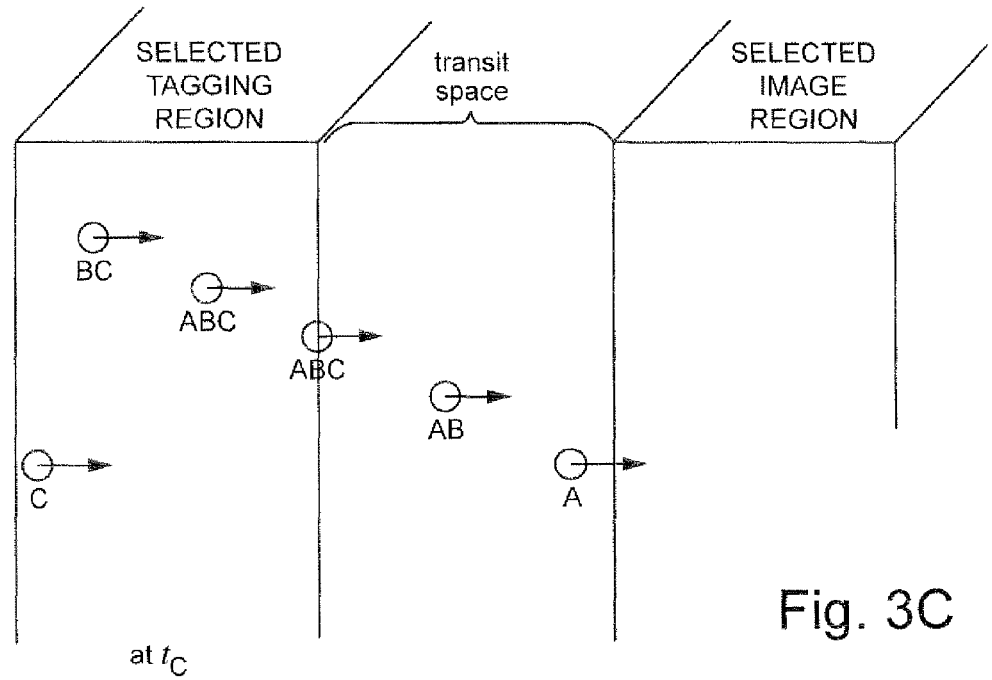

As depicted in FIG. 3C, those same five groupings of nuclei have moved yet further at tagging time tC. Now the first two groupings are located within the transit space at tag time tC, while three others are still within the tagging region so as to potentially be tagged with another tag pulse at this time. Now there are at least five cohorts of tagged nuclei: A, AB, ABC, BC and C.

Figure 3D:
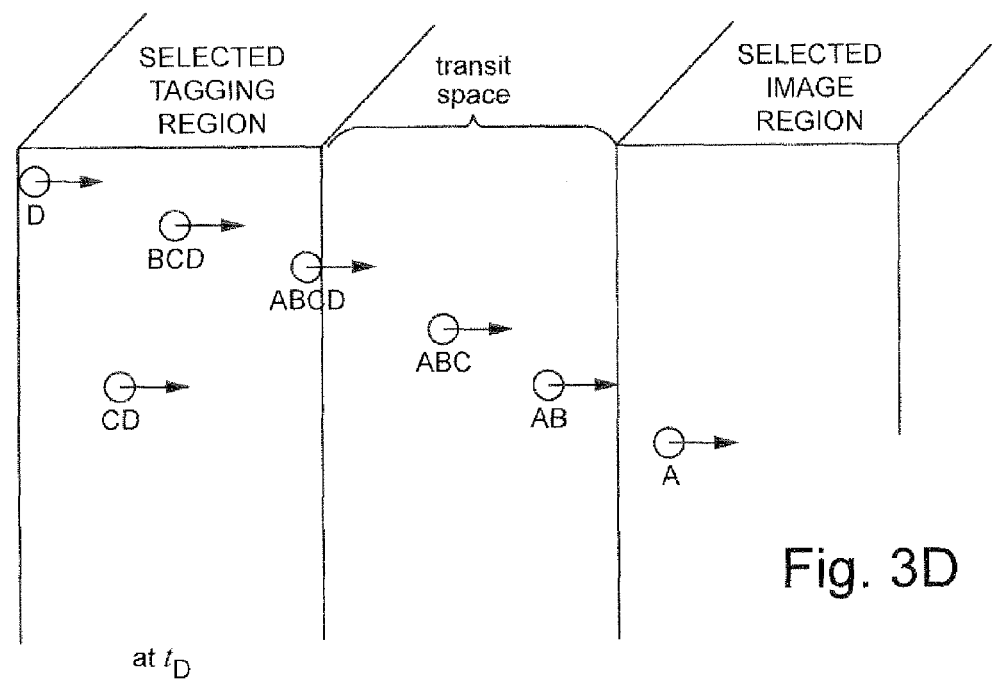

At tagging time tD a depicted in FIG. 3D, a new group of nuclei is depicted as entering the selected tagging region so as to have four groups within the tagging region at the same time, while three other groups are already outside the tagging region and indeed a first group has already arrived at the selected image region. At this point, there are now at least seven different cohorts of NMR nuclei defined by tagging pulses A-D: A, AB, ABC, ABCD, BCD, CD and D.

As will be appreciated, even more cohorts of species may be defined by using different patterns of on/off tagging pulses at different successive elapsed possible tagging times. Each of these different cohorts of nuclei may have experienced a different pattern of tagging for corresponding different TR instances of the data acquisition sequence depicted in FIG. 2.

In subsequent analysis and decoding, it is possible to choose to use cohorts which are expected to have non-zero amounts of spins associated with them. Similarly, analysis and decoding may be chosen so as to ignore possible cohorts for which there are expected to be no nuclei within the cohort. For example, another possible cohort AC may or may not be included with the previously described cohorts of FIG. 3. If the geometry of major vessels is such that nuclei in blood are not expected to leave the tagging volume and then return again within the tagging times to through tD, then such a possible cohort AC is expected to be empty, and need not be included in subsequent steps.

Likewise in FIG. 3D, additional cohorts such as B, C, and BC are possible. Perhaps however, based upon the timing of tags, the spatial width of the tag, and assumptions of maximum blood flow velocities in the region, it could the case that such cohorts can be excluded from the analysis on the grounds that they imply flow velocities which are unreasonable. Again, leaving out some conceivable cohorts is not necessarily wrong, and in fact might improve overall quantification.

Having knowledge of the predetermined patterns used in the successive data acquisition sequences for tagging, an appropriate decoding process may then take place so as to decode the acquired MRI data in accordance with those predetermined patterns and thereby detect MRI signals emanating from the different cohorts of flowing nuclei that have been subjected to respectively different combinations of RF NMR nutation tagging pulses. The acquired and decoded MRI data may then be used to construct various images representing flowing nuclei within the selected image region.

For example, the process may be designed so as to ensure that at least some cohorts of flowing nuclei have been subjected to a plurality of nutation pulses and/or to ensure that each cohort of flowing nuclei has been subjected to at least one nutation pulse, etc. As explained in greater detail below, it may also be desirable to execute at least one MRI data acquisition sequence so as to acquire MRI data without any tagging pulse occurrence so as to acquire MRI data that can be used in the decoding process to reduce background MRI signals from non-flowing nuclei located within the selected image region.

In the preferred embodiments, the tagging pulses are NMR nutation pulses that substantially invert NMR magnetization for at least some of the cohorts by effecting substantially 180° of nutation.

As will also be explained in more detail below, since signals from different cohorts associated with different timing intervals can be identified, it is also possible to compensate for expected effects of imperfect inversion or for respectively different T1 NMR relaxation signal decay occurring for different cohorts due to different respectively associated elapsed times after their tagging until MRI data acquisition occurs. Magnetization transfer contrast could be yet another effect to be compensated for, by including it in the model of how cohorts are encoded and decoded.

If desired, it is possible to generate a different image for each of the different flowing nuclei arrival times at the selected image region or a different image for each of different tagging times representing different cohorts of flowing nuclei.

It is also possible to generate a blood perfusion value for at least a portion of the selected image region using acquired MRI signal levels associated with a plurality of tagging times.

In the preferred embodiments, encoding is performed in accordance with a predetermined encoding matrix and decoding is performed in accordance with a decoding matrix that is an inverted version of the encoding matrix (e.g., a pseudo-inverse or least-squares minimization of regression coefficients to be used in the decoding matrix).

Since there are many adjustable parameters of the exemplary ASL pre-sequence tagging period, it is possible to use adjustments in such parameters so as to optimize the ASL imaging process. For example, the expected effectiveness of decoding for a given tagging process can be used to optimize tagging period parameters such as nutation magnitudes of the tagging pulses, magnitudes of the elapsed intervals between tagging times, the predetermined pattern itself of on/off tagging pulse occurrences, the spatial location of the selected downstream image region and/or of the selected upstream ASL tagging region, the spatial extent of the selected imaging region and/or selected ASL tagging region, and the like.

As mentioned previously, for a finite sized tagging region, different cohorts of flowing nuclei may be defined by the nuclei that flow both into and out of the selected ASL tagging region during the tagging period.

Figure 4:
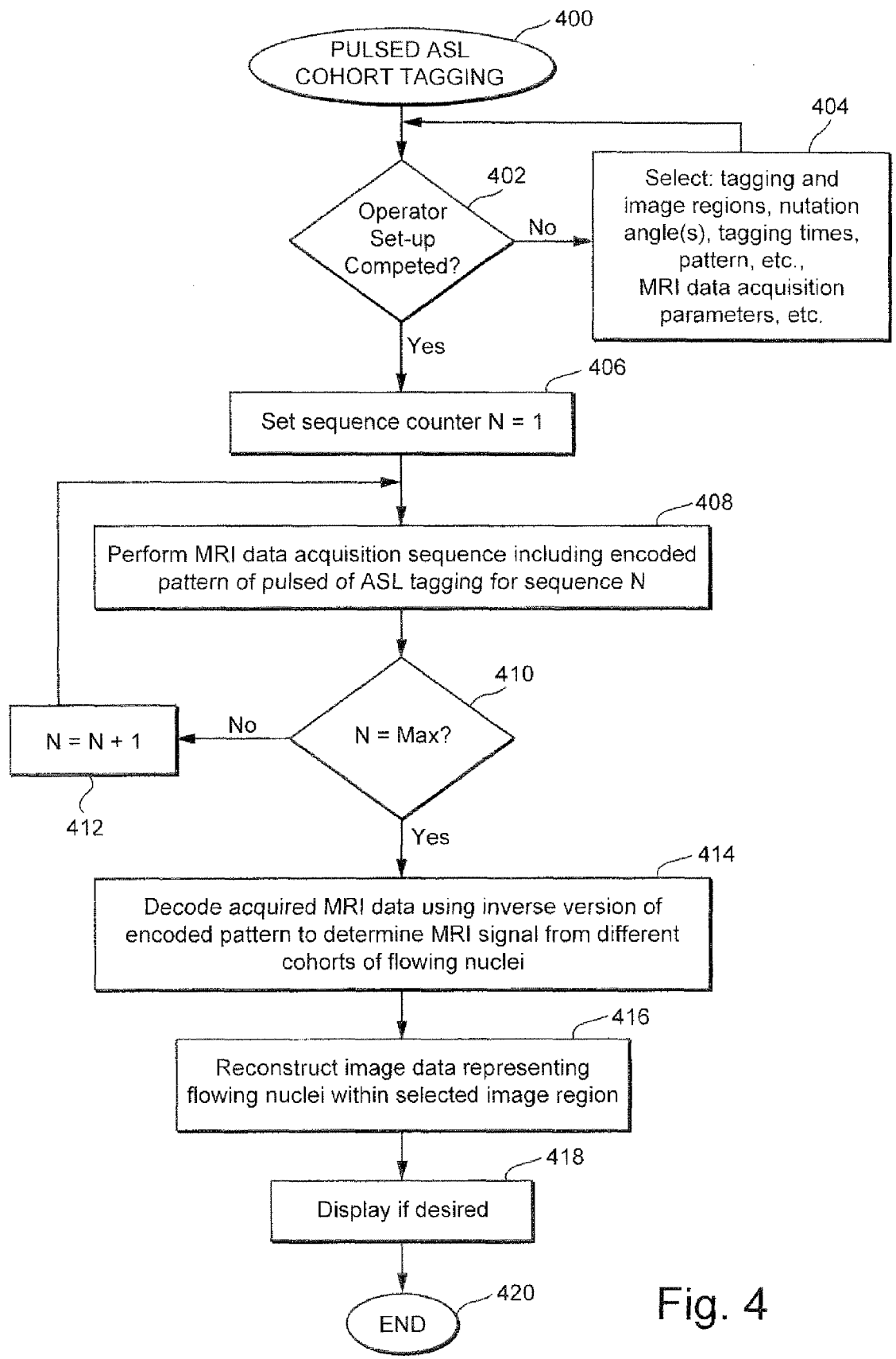
FIG. 4 is a schematic illustration of exemplary computer program code structure in the form of a flow chart for implementing an exemplary pulsed ASL cohort tagging process in the system of FIG. 1.

FIG. 4 schematically depicts a possible program code structure that may be entered at 400 for use in the system of FIG. 1 in the exemplary ASL cohort tagging routine. A test is made at 402 to see if operator setup inputs have been completed. If not, then an opportunity is given the operator at 404 so as to select tagging and image regions, nutation angles, tagging times, tagging patterns, etc., including MRI data acquisition parameters for use in the read-out of tagged nuclei cohorts, etc. Once operator setup is completed, then a sequence counter N is initialized at 406 before a first TR instance of an MRI data acquisition sequence is executed at 408. As depicted in FIG. 2, for example, such a data acquisition sequence includes an initial pre-sequence encoded pattern pulsed ASL tagging period that may be defined differently for each TR interval. After data has been acquired for one repetition interval TR, then a test is made at 410 to see if the sequence counter has yet completed the maximum desired number of sequences. If not, then a sequence counter is incremented at 412 and another instance of MRI data acquisition is executed at 408.

Once all of the desired MRI data has been acquired, then control is passed to a decoding process at 414 where the acquired data is decoded using an inverse version of the encoded pattern to determine MRI signals from different cohorts of flowing nuclei. Thereafter, at 416, image data is reconstructed so as to represent flowing nuclei within the selected image region and, if desired, is displayed at 418 (or stored, transferred to another system, etc.) before this subroutine ends at 420 and control is passed back to the calling operating system or other software.

For pulsed ASL (PASL), multiple tag pulses, separated by delay intervals, can be applied within a single shot. The application of the RF tagging pulses can be turned on and off in different patterns for different shots. Each tag pulse can be turned on or off individually to generate a multiplexing pattern. The data from the shots can be combined in different ways to allow separate output images to be generated for each temporal tagging cohort of flowing nuclei.

Now, the tagging scheme and encoding is described in two ways. The description of which tag pulses are applied and have effect in each repetition will be denoted as the "tagging schedule matrix". The description of signal strength (perhaps at time of readout excitation or readout acquisition) for each considered cohort and for each TR of the tagging pattern will be denoted as "the encoding matrix". For each repetition in the tagging schedule matrix, and for each cohort considered in the encoding matrix, the cumulative effect of tagging can be modeled and computed. That is, from the tagging schedule matrix, plus the definition of the cohorts, one can generate the encoding matrix.

The tagging pulses are, in effect, multiplexed in accordance with a tagging schedule matrix and then separated with a decoding operation that can be thought of as applying an inversion of the "encoding matrix". In one extreme case, similar to Hadamard encoding, N cohorts can be separated from M=N acquisitions. In another extreme case, the N cohorts can be separated from $M=2^N$ acquisitions, in all of the binary logical combinations. In an intermediate range, some subset of acquisitions can be collected and the encoding matrix can be inverted with a generalized pseudo-inverse or least-squares calculation.

Steps in this process may be:
(1) Separate the pre-sequence tagging period into P temporal segments by applying multiple tag nutation pulses.
(2) Generate a tagging schedule matrix for M repetitions. In each of the M shots, indicate which of the P pulses or intervals are actively encoding inflow (i.e., the tagging pulse is "on"), and which are not (i.e., the tagging pulse is "off").
(3) Acquire the M shots, each with an appropriate RF pre-sequence pulse pattern to create the intended tagging schedule pattern.
(4) For each of N cohorts under consideration, calculate the encoding imposed on the cohorts. This information forms an encoding matrix of M by N elements.
(5) Calculate the inversion matrix to determine how to best estimate the signal from each encoded cohort (and best reject the signal generated from other cohorts).
(6) Reconstruct each shot separately and combine the shots according to the inversion matrix to get an image associated with each tagged cohort.
(7) Optionally, combine images of the separate cohorts together in various ways, such as sums over similar arrival times, similar tag region exit times, etc. to make effective images with a larger aggregate of cohorts.

It is noted that the repetitions of the tagged acquisition and their tagging patterns need not all be uniquely distinct from each other. Some or all distinct lines of the tagging schedule pattern may be acquired in multiple (duplicated) repetitions. Accordingly, the tagging schedule matrix and the encoding matrix may be condensed, where the lines are uniquely distinct from each other, the number of distinct lines M is less than the number of repetitions R, and each line of these condensed matrices may have a number of averaged repetitions associated with it, either implicitly or explicitly.

It should be noted that since linear reconstruction processes are typically employed, one can alternatively perform the combining step in the frequency k-space domain, if desired.

In a simple example, if four MRI sequence shots are used to acquire data from three different cohorts, then after decoding and reconstruction, each encoded cohort has an SNR (signal-to-noise ratio) equivalent to a four-shot scan. Thus, the new multiplexed scan of only four shots may replace three conventional scans of four shots each (i.e., twelve total shots).

The exemplary embodiment may allow more efficient exploration of physiological blood-flow phenomena. In another set of applications, it may allow better detection of basic perfusion, since one may be able to largely remove the problem of selecting one or more appropriate tagging times, which often confounds conventional perfusion measurements.

In ASL, flowing blood is first "tagged" in an inflowing artery or arteries using, typically, an inversion RF pulse (i.e., 180°). Following a period of time, the tagged blood flows into the anatomy of interest. After a fixed delay interval, the tagged magnetization is detected by MR imaging. Depending upon factors that affect sensitivity in different vessels and tissues, ASL can be used to probe tissue perfusion, or larger vascular structures (angiography). ASL can also be used to look at functions that are related to blood flow and perfusion, such as brain function activation or tissue response to therapy.

A general challenge with ASL is how to choose the amount of time between application of the arterial tag and detection. This challenge matters for many reasons. It affects sensitivity of the ASL experiment (which is very important in ASL-ASL is intrinsically a low-sensitivity method compared to other typical MRI). It affects comparisons across anatomy in a subject. It affects the specificity to different blood flow components (such as major vessels versus capillary bed perfusion). It affects attempts at quantification. The tag-detection delay time is a pulse sequence parameter, which is closely linked to physiological parameters of various blood transit times and arrival times. Sometimes the arrival times are of primary interest to the diagnosing physician.

With the exemplary embodiments, one may effectively collect several "scans worth" of data with a single scan of shorter time. Alternately, a set of several conventional ASL scans, each of shorter times, can be replaced by a single new scan with comparable total time, but with a significant increase in SNR.

The application of the exemplary embodiments is not limited to perfusion ASL, but can also be applied to angiography applications of ASL (like time-SLIP) and/or can be used in conjunction with time-SLIP and multiple TI's to acquire time—and/or SNR-efficient time-resolved non-contrast-enhanced MR angiography.

Some benefits of the exemplary embodiments may be:
more information about time dependence (arrival time, mean transit time) etc. in the same scan time, and/or better efficiency of scan time or total SNR when demanding a certain amount of temporal information. Depending upon the application, one may obtain more reliable insight into variations of flow dynamics and/or perfusion information that is not as skewed by unanticipated variations in arterial timing.

Multiple cohorts of ASL signal can be detected efficiently in a single experiment.

Increased signal to noise ratio may be achieved when multiple time courses of tagged signal are to be acquired.

Utility of scans may be improved, or interpretation of scans simplified since the difficulty of selecting suitable arrivals times or suitable inversion times is reduced.

Additional useful information may be provided from an ASL scan, such as representations of multiple arrival times, multiple tag volume exit times.

Accuracy of quantification may be improved, since distinct cohorts of flowing nuclei and can be compensated for independently, with respect to the detailed signal encoding for each cohort.

Accuracy of perfusion measurements may be improved by appropriate combination of multiple cohorts.

More effective tagging schedules and overall choice of tagging parameters may be generated and used, based upon quantitative analysis of encoding and decoding effectiveness of possible schedules.

These and other advantages will be appreciated by those skilled in the art.

Suppose one chooses four tagging-times, and suppose the background signal in the imaging slice or volume is ignored. Here, tagged signal is denoted with a value of "−1", indicating inversion (e.g., 180°). There is no reason time intervals between tagging pulses must be uniformly spaced.

A Hadamard-matrix is a natural choice for an encoding scheme, if one uses a minimal number of encoding pulses.

TABLE 1

Encoding Matrix "H", Hadamard Style Encoding.

|  | Segment 1 | Segment 2 | Segment 3 | Segment 4 |
| --- | --- | --- | --- | --- |
| Shot 1 | −1 | −1 | −1 | −1 |
| Shot 2 | −1 | 1 | −1 | 1 |
| Shot 3 | −1 | −1 | 1 | 1 |
| Shot 4 | −1 | 1 | 1 | −1 |

The inversion matrix is easy—it turns out to be a trivial copy of the encoding matrix. More exactly, one can call the inverse "the decoding matrix", and the decoding matrix is identical to the transpose of the encoding matrix. And since all elements in the inversion matrix in this example have equal squares, there is no noise amplification. This noise amplification performance is like doing parallel imaging and having a "g-factor" of 1.0. Note that an encoding matrix with values all "1" or a "−1" is not always encountered in the general case for pulsed ASL, as is further discussed below. Such values may occur in limiting cases of actual encoding schemes, when ignoring effects like imperfect inversion or T1 relaxation. But for the specific purpose of illustrating different matrix sizes, these simple matrices suffice.

Or one can have the other extreme, where the complete set of all possible encodings is used:

TABLE 2

Encoding Matrix "B", Binary Powers Style.

|  | Segment 1 | Segment 2 | Segment 3 | Segment 4 |
|---|---|---|---|---|
| Shot 1 | 1 | 1 | 1 | 1 |
| Shot 2 | 1 | 1 | 1 | −1 |
| Shot 3 | 1 | 1 | −1 | 1 |
| Shot 4 | 1 | 1 | −1 | −1 |
| Shot 5 | 1 | −1 | 1 | 1 |
| Shot 6 | 1 | −1 | 1 | −1 |
| Shot 7 | 1 | −1 | −1 | 1 |
| Shot 8 | 1 | −1 | −1 | −1 |
| Shot 9 | −1 | 1 | 1 | 1 |
| Shot 10 | −1 | 1 | 1 | −1 |
| Shot 11 | −1 | 1 | −1 | 1 |
| Shot 12 | −1 | 1 | −1 | −1 |
| Shot 13 | −1 | −1 | 1 | 1 |
| Shot 14 | −1 | −1 | 1 | −1 |
| Shot 15 | −1 | −1 | −1 | 1 |
| Shot 16 | −1 | −1 | −1 | −1 |

Once again, this special matrix is its own inverse. (Or more exactly, its mathematical pseudo-inverse is formed simply by a transpose.) Also, the noise gain associated with the inversion is 1.0, the theoretical minimum.

But there is nothing that prevents one from using some "intermediate" encoding, using a partial subset of the full binary power encoding. Consider an example intermediate encoding.

TABLE 3

Encoding-and-Acquisition Scheme "E", Intermediate Encoding Style.

|  | Segment 1 | Segment 2 | Segment 3 | Segment 4 |
|---|---|---|---|---|
| Shot 1 | 1 | 1 | 1 | 1 |
| (Not collected) | | | | |
| Shot 3 | 1 | 1 | −1 | 1 |
| Shot 4 | 1 | 1 | −1 | −1 |
| (Not collected) | | | | |
| (Not collected) | | | | |
| Shot 7 | 1 | −1 | −1 | 1 |
| Shot 8 | 1 | −1 | −1 | −1 |
| Shot 9 | −1 | 1 | 1 | 1 |
| (Not collected) | | | | |
| Shot 11 | −1 | 1 | −1 | 1 |
| (Not collected) | | | | |
| Shot 13 | −1 | −1 | 1 | 1 |
| Shot 14 | −1 | −1 | 1 | −1 |
| (Not collected) | | | | |
| (Not collected) | | | | |

Or compressing this table down (and renumbering the shots) . . .

TABLE 4

Encoding Matrix "E", Intermediate Scheme.

|  | Segment 1 | Segment 2 | Segment 3 | Segment 4 |
|---|---|---|---|---|
| Shot 1 | 1 | 1 | 1 | 1 |
| Shot 2 | 1 | 1 | −1 | 1 |
| Shot 3 | 1 | 1 | −1 | −1 |
| Shot 4 | 1 | −1 | −1 | 1 |
| Shot 5 | 1 | −1 | −1 | −1 |
| Shot 6 | −1 | 1 | 1 | 1 |
| Shot 7 | −1 | 1 | −1 | 1 |
| Shot 8 | −1 | −1 | 1 | 1 |
| Shot 9 | −1 | −1 | 1 | −1 |

An inversion of the encoding matrix E can give a decoding matrix D, as $$D = E^{TRANSPOSE} * INV(E^{TRANSPOSE} * E)$$ (Equation 1).

Clearly some encoding schemes will work better than others, in that they will have more independence and less partial redundancy between shot encodings. Matrices that in some sense are less uniform, or have more total correlation between all sets of rows, are expected to have inverses that are not as tidy, and noise amplification that is higher than 1.0. Often, determining the strengths of cohort signals from actual acquired data will be an over-determined problem, but appropriate solution or estimation methods for such problems are very well known.

It is also noted that these inverses need not be scaled such that the resulting product of encoding and decoding yields results of "1". It is perfectly reasonable that when M or R tagging patterns are used, the elements in the decoding matrix may be essentially plus or minus 1, as opposed to plus or minus 1/M or plus or minus 1/R as would be common in typical mathematical usage. Leaving the decoding matrix and the final detected signal scaled by a factor such as "M" or "R" is a minor detail which has essentially no impact on the overall application of this exemplary embodiment.

The intermediate case should not be ignored. It may be very important when high temporal resolution (of tag inflow or arrival time) is needed. For example, if one wishes to extract ten cohorts, then ten shots may be insufficient for SNR, but 1,024 shots is excessive. An "intermediate" encoding has potential to do better signal separation than a simple averaging of a Hadamard minimal encoding.

Some variants of the encoding scheme can be envisioned. Consider the signal from non-flowing material in the slice, such as general brain parenchyma, or at least the part of it that is imperfectly suppressed. One might choose to "get rid of" that signal by using some explicit 2× alteration of the entire encoding scheme, for what amounts to "tag" versus "control". On the other hand, one can also treat the "unsuppressed background" as just one more species, on an equal footing with each of the temporal segments of tagging.

For example, in a "Hadamard-like" encoding, with four segments, if one ignores background, then there is enough data to estimate the four segments from four shots. Now consider the background, and do something to suppress it, too. One approach is to use 4+4=8 total encodings. Another approach is to use 4+1=5 encodings. Either approach works (although admittedly the 5× inversion may not be as ideal as the 8× inversion).

Suppose the unsuppressed background species is treated as something that is always present, and methods to explicitly invert it are not used. Then one could reinterpret the 4× Hadamard matrix previously shown as a method for handling three time segments plus background.

TABLE 5

Hadamard Style Encoding, 3 Inflows Plus Background.

|        | Background | Segment 1 | Segment 2 | Segment 3 |
|--------|------------|-----------|-----------|-----------|
| Shot 1 | 1          | −1        | −1        | −1        |
| Shot 2 | 1          | 1         | −1        | 1         |
| Shot 3 | 1          | −1        | 1         | 1         |
| Shot 4 | 1          | 1         | 1         | −1        |

This matrix looks a little less tidy, or at least less symmetrical, but its inverse (decoding matrix) is still simply its transpose. While there may be no interest in explicitly looking at the background signal, one may very well want to make sure that the background is properly cancelled from appearing in the ASL signals. It is also reasonable to set the background values higher (or lower), such as if the scan had no internal background reduction in a single shot, background values might be 100, that is, unsuppressed tissue is 100 times the nominal perfused blood signals.

With the encoding matrix, it is possible to describe the encoding as not just "+1" versus "4", but also it is possible to build in estimates of T1 decay. Note that the T1 decay effect may have non-trivial influence since, for different shots, the flow that originated from a given temporal segment will have different times during which it is nominally inverted and during which it is nominally restored. In general, loss of tag by T1 decay may be "faster" when a population is inverted, and "retarded" when it is restored. Different mixings of "fast decay" and "retarded decay" will lead to different anticipated final ASL signal levels for different shots. This may have some effect if full binary-powers of encoding are used. The simple inversion matrix without decay can still yield a useful inversion (correct cancellation of signal starting from other temporal intervals), but it may not be the most powerful choice of inversion in terms of least noise amplification. Consideration of the full encoding formula with decay may lead to improved control of thermal noise. Secondly, if signals from earlier temporal tagging segments spend average time "restored" and with "retarded decay", one can find that the absolute strength of the ASL signal from an earlier segment is actually increased.

This effect may be more important, however, when Hadamard-like encoding is used and an attempt is made to strip apart N cohort components from N (or just a few more than N) shots. In that case, it may be very important to look at the actual decay-weighted encoding matrix, as opposed to using the simpler ideal decay-free encoding matrix.

As a "cartoon" example, consider the following simple scheme. Two tags are used, denoted A and B. The tagging schedule is 4 shots, with full binary encoding. The cohorts are listed in order as:

cohort 1=(insensitive to A, insensitive to B), including tissue background in the imaging slice cohort 2=(sensitive to A, insensitive to B)

cohort 3=(insensitive to A, sensitive to B)

cohort 4=(sensitive to A, sensitive to B)

The T1 decay from time A to time B yields 25% signal loss, and the T1 decay from time B to the imaging time yields another 25% signal loss.

Then the encoding matrix will then look like:

TABLE 6

Encoding, fully binary pattern, two tag pulses, with T1 relaxation.

|          | 0, 0 shot | A, 0 shot | 0, B shot | A, B shot |
|----------|-----------|-----------|-----------|-----------|
| cohort 1 | 1         | 1         | 1         | 1         |
| cohort 2 | 1         | −.125     | 1         | −.125     |
| cohort 3 | 1         | 1         | −.5       | −.5       |
| cohort 4 | 1         | −.125     | −.5       | +0.625    |

The effective inversion efficiency of each tag pulse can be treated with a similar analysis. The on/off application of each pulse can possibly affect the effective inversion efficiency of each cohort. These effective inversion efficiencies (or estimates thereof) can be represented within the encoding matrix.

As another "cartoon" example, consider the same simple acquisition scheme. The T1 decay is ignored in this case. For purposes of illustration, assume inversion pulses are 95% efficient, that is they would flip initial positive Mz magnetization to negative 90% magnetization, and the remaining signal is lost to mechanisms such as de-phasing of Mx/My components.

Then the encoding matrix will then look like:

TABLE 7

Encoding, fully binary pattern, two tag pulses, with T1 relaxation.

|          | 0, 0 shot | A, 0 shot | 0, B shot | A, B shot |
|----------|-----------|-----------|-----------|-----------|
| cohort 1 | 1         | 1         | 1         | 1         |
| cohort 2 | 1         | −.9       | 1         | −.9       |
| cohort 3 | 1         | 1         | −.9       | −.9       |
| cohort 4 | 1         | −.9       | −.9       | +0.81     |

Similarly, encoding matrices may reflect both of these effects. If necessary, encoding can be computed by time integration of the Bloch equations.

Yet other detailed effects of specific pulse schemes could be included in the estimates of the forward encoding matrix. Magnetization transfer saturation effects could be estimated, for example.

It is conceivable that when there are longer elapsed time windows for allowed tag inflow, one may see an averaging of physiological variation due to cardiac pulsatility, even within a single shot. A special situation may occur when the tag-inflow-window is essentially a multiple of the R-R window, where fluctuation within a cardiac cycle is "fully averaged". Thus, images associated with narrow windows could exhibit more "physiologic noise" in the ASL signal. However, if the multiple temporal windows are reconstructed and then added to produce an effectively longer window, one should get back to the original situation of better R-R-cycle averaging and not have lost anything compared to more conventional methods.

When a significant range can exist across the cohorts, there is the possibility that one may improve absolute perfusion calculations by stripping apart the cohorts and correcting the flow calculation accordingly. If one can measure contributions from distinct cohorts, then one can provide a T1 decay correction that varies for the different time cohorts. Suppose a slice had delayed arrival time in, say, the left hemisphere. Maybe the left hemisphere had typical arrivals of 1600 msec, but the right hemisphere equivalent tissue had arrivals of 1000 msec. Maybe the decay on the left is something like exp(−1600/1300) and on the right it is something like exp(−1000/1300), where 1300 is a T1 of arterial blood. These convert to residual decayed signals of 0.46 versus 0.29, which could be mistaken for a relative difference of 1.6 in tissue perfusion if the decay times are not corrected.

If one can calculate forward encoding coefficients for any set of N cohorts and M encodings, then one can calculate practical inversions and the overall effectiveness of the total scan. The effectiveness can be given as an objective, such as a least-squares goodness of retrieving the signals of the species, plus an additional noise measure. Such an effectiveness can be used as an objective function in an optimization process.

One possible optimization would be to adjust the times of some pre-pulses (i.e., the temporal locations of some or all inversion pulses).

Another possible optimization is to search for which subsets of possible encodings give the best overall results. Suppose one wishes to detect six time-encoded intervals and suppress background. Seven "species" might need to be resolved. But 128 acquisitions for the full binary encoding would be too many to acquire (with TR in excess of 2.5 seconds). Suppose twenty pulses are arbitrarily selected. One could search for which particular twenty encodings to use. The search space of all candidate encoding schemes would be huge, possibly on the order of ($128^{20}/20!$) possible choices, but with a search algorithm like simulated annealing or genetic algorithms, one could find combinations that perform much better than "randomly chosen" encodings.

The exact method of such optimization may not be too important. The point is that many such optimizations are feasible, and they fit well with the general model of multiple encodings, each applied to multiple species, followed by an inversion to generate the decoding matrix.

Not only is there tremendous flexibility provided by the exemplary embodiments, but they also offer reduced SAR (specific absorption ratio), improve immunity to delta-B1 and/or eddy currents and permit some compensation for imperfection of tagging at transitions.

There is no reason that the spatial locations associated with tagging pulses must be identical. Cohorts may still be defined for various nuclei which are sensitive or insensitive to tagging pulses, where the pulses may vary in both time and position, and encoding and decoding can still be performed for these cohorts.

In pulsed ASL (PASS), conventional MRI transmitter and RF coils are typically used to flip a selected region of flowing spins. After waiting T1 (inversion time), a conventional MRI data acquisition cycle is performed (e.g., an EPI (echo planar imaging) shot). Subtraction of reconstructed control and tagged image data, i.e., image=(control−tag), can then be performed on a pixel-by-pixel basis. A typical tagging volume may be a slab on the order of 10 cm thick.

A possible tagging pulse sequence applies slice-selective RF nutation pulses (e.g., 180°). Following this, an MRI data acquisition pulse sequence of a single "shot" may be used (e.g., an EPI single shot sequence using a single slice-selective RF excitation pulse (e.g., 90° in a single shot EPI sequence)). Such single shots (each with its own suitable pre-sequence on/off pulse pattern) are repeated R times with tagging—and R times without tagging—to create a "control" image. Typically, all R control shots are averaged together and all R tagged shots are averaged together. The summed tag shots are then subtracted from the summed control shots to provide resultant image data.

Often TI is in the range of 1200 ms to 2400 ms and typical transit times may be 700 ms to 1400 ms for blood to move from the tagging volume into the selected image slice. Typically, after blood water perfuses into brain cells, it stays there for a time which is long compared to MRI relaxation times, or compared to the TR and TI of the pulse sequence. Thus for brain perfusion, one may be able to ignore outflow of the perfusion signal.

The amount of tagged signal is typically small, e.g., about 1% of the detectable brain tissue MRI signal. SNR is important in such a subtraction process and thus the use of averaged MRI data.

Many embellishments may be used in real-world sequences, such as extra pulses to knock down background. The tag versus control effect can be achieved in various different ways. For example, the "control" data could be achieved by turning all tag pulses off, moving the spatial position beyond the top of the patient's head, moving the RF tag pulses "off resonance", changing the width of the tagging slab region such as an extremely wide slab versus a thin slice (right on or close to the imaging slice).

All of these embellishments influence "second order effects" that can reduce effectiveness of the subtraction process (e.g., like MTC (magnetization transfer contrast), venous flow, bright spots inside arteries in the imaging slice, etc.).

Choices of TI and/or the transit time window (e.g., duration of long transmit pulses) may have difficult tradeoffs. For example, if TI is too long, tag signal "recovers" with T1 relaxation. On the other hand, if TI is too short, it x-ray not get to the whole region.

A relatively few tag pulses may be used to cover a range of "TI" or "arrival times" or "transit times". The pulses may be turned on and off independently in different patterns in different MRI data acquisition shots. Each on/off pattern of tags effects different "encoding" of different flowing spin cohorts.

The encoding effect is computed or modeled on different cohorts of flowing spins (e.g., blood nuclei) for each pattern of on-and-off tags.

MRI signals "S" are optionally collected in, e.g., 2D. The encoding matrix can be inverted:

$$\begin{vmatrix} \text{Signals} \\ \text{vector} \end{vmatrix} = \begin{vmatrix} ^{11}Encoding^{1n} \\ _{m1}matrix_{mn} \end{vmatrix} \cdot \begin{vmatrix} \text{Cohorts} \\ \text{vector} \end{vmatrix}. \quad \text{(Equation 2)}$$

$$S = E \cdot C. \quad \text{(Equation 3)}$$

Suppose there are m data acquisition shots, and suppose there are n cohorts of moving spins. Then a decoding matrix, symbolically:

$$D = 1/E \quad \text{(Equation 4)}$$

can be used to solve for C:

$$C = S/E = D \cdot S \quad \text{(Equation 5)}.$$

This may be important because the process can be sensitive to many cohorts and many arrival times in one efficient experiment (while also providing more total signal and/or a better SNR). The resulting images can be displayed for different cohorts, e.g., different arrival times to provide flow dynamics that may be of direct interest to physicians.

The exemplary embodiments can advantageously utilize non-trivial, effects of multiple pulses, whereby a choice of "cohorts" or "similarly encoded populations" can be chosen with reference to the detailed tagging scheme.

Figure 5:
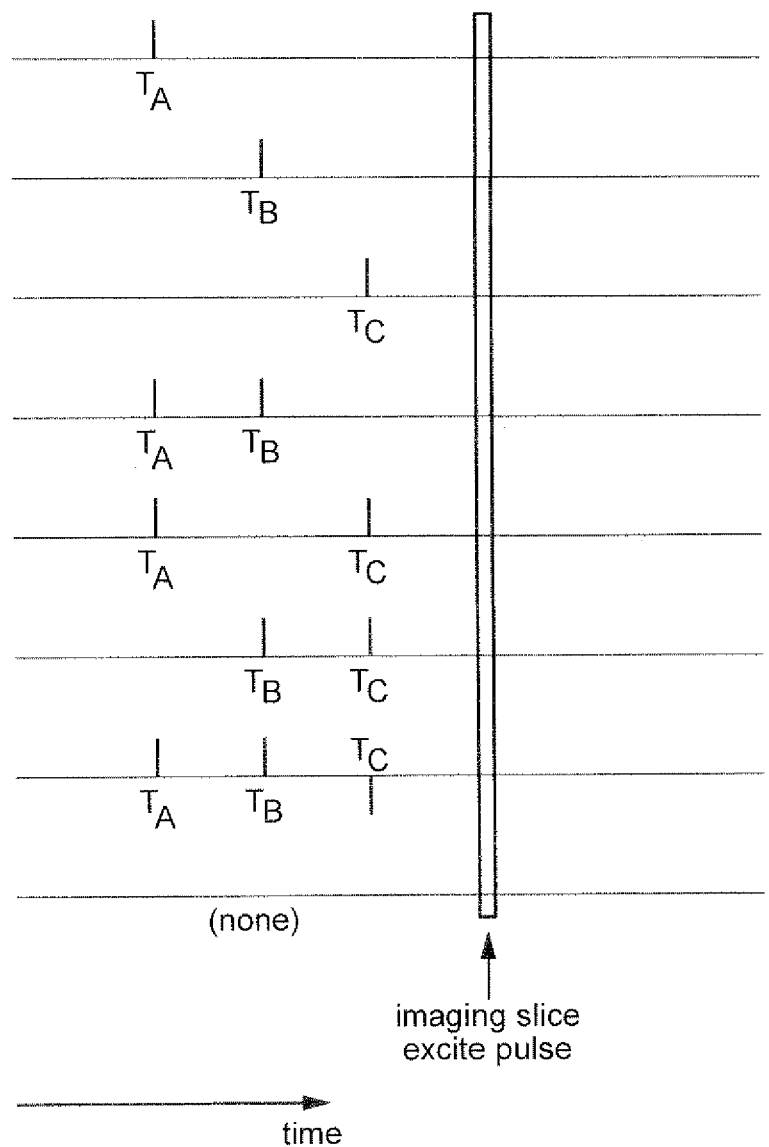
FIG. 5 is a schematic timing diagram illustrating a simple tagging pattern using only three tagging pulses TA-TC for illustrative explanatory purposes.

In what may be the most simple pulsed ASL example (e.g., see FIG. 5), assume there are three temporal RF nutation tags TA, TB, TC, each imposed at the same selected spatial location (tagging region), which extends physically a large distance from a selected imaging slice region as depicted in FIG.

Figure 6:
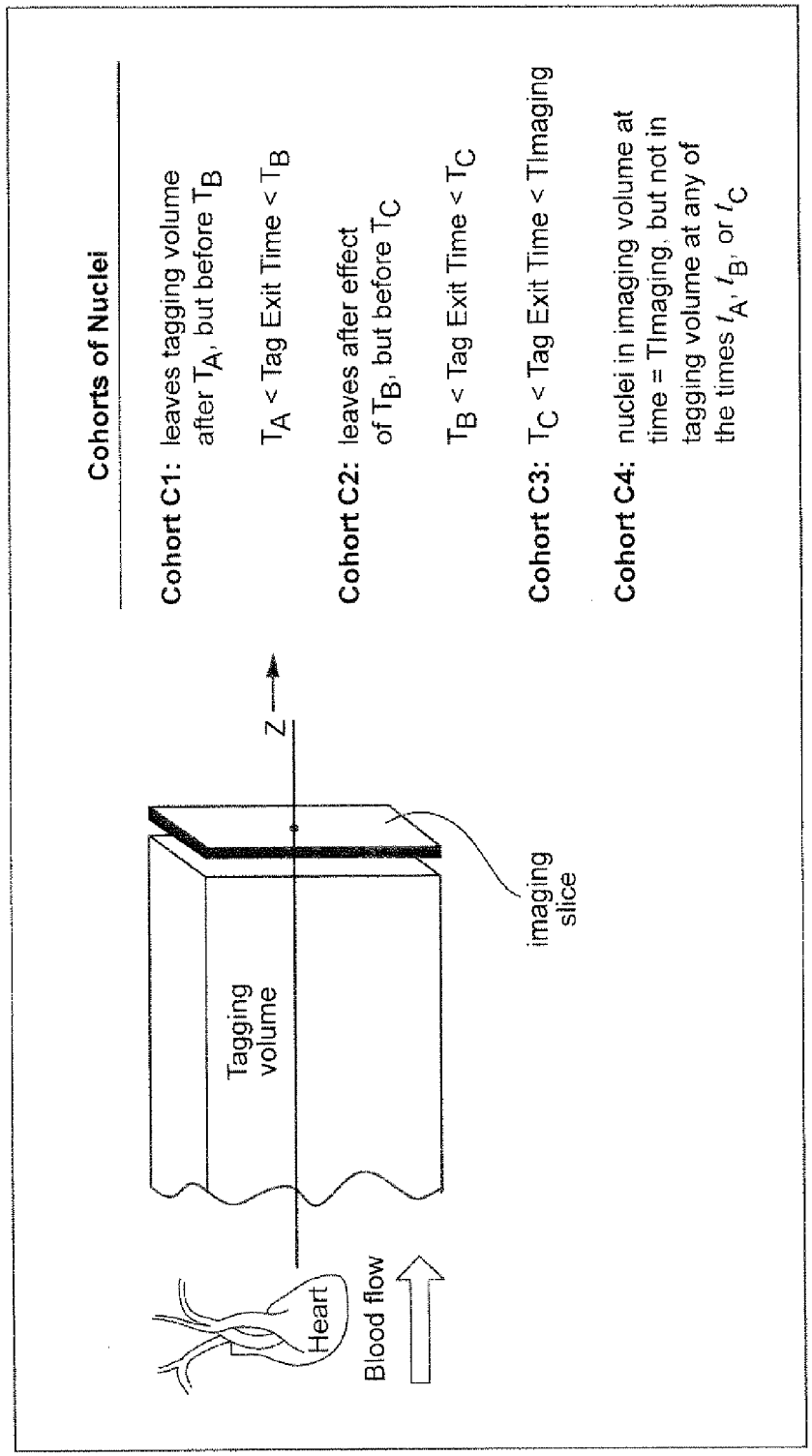
FIG. 6 illustrates a possible spatial physical layout for a tagging volume that is quite thick and closely spaced to the selected imaging slice so as to effectively define different tagged nuclei cohorts as a function of their exit times from the tagging slab.

6. If spins "entering" the tagging volume are ignored (e.g., because as depicted in FIG. 6, the tagging volume is very thick), then cohorts of nuclei may be identified by the time they leave the tagging volume. If the tagging volume is very close to the imaging slice, this may be effectively about the same as when the spin cohorts enter the imaging slice. Cohorts C1, C2, C3 of flowing nuclei may thus be defined as shown in FIG. 6.

In this simple formula for encoding, to get the net effect of tag pulses, one may count the number of inversions sensed by a cohort. If the number is odd, the effective tagging signal factor is −1. If the number is even, then the signal is effectively encoded by a factor of 1 (i.e., not inverted).

Figure 7:
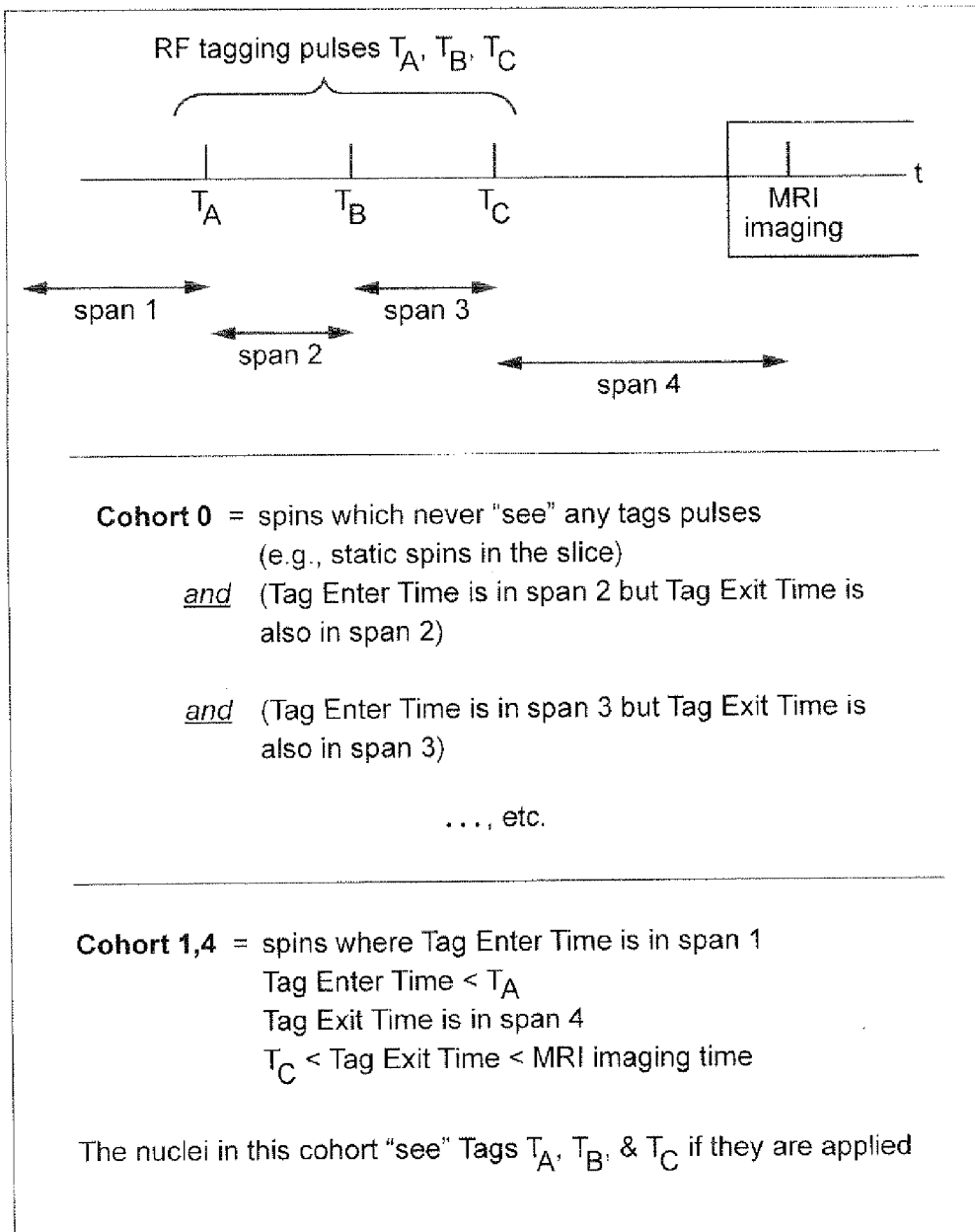
FIG. 7 is a schematic timing diagram also for a relatively simple illustrative case using only three tagging pulses at times TA-TC—but this time with respect to a finite thinner tagging slab thickness, thus effectively defining cohorts of nuclei by both entrance and exit times to the tagging slab (e.g., with respect to the time spans 1-4 as defined by tagging pulse time occurrences)
Figure 8:
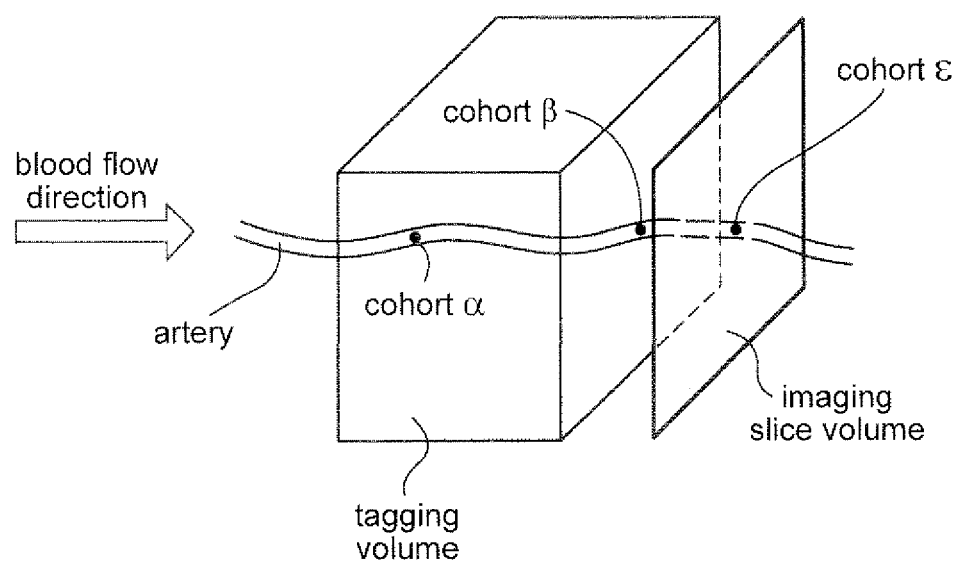
FIG. 8 is a schematic spatial diagram showing blood flow through a meandering artery in the tagging volume and onward through a transit space to the imaging slice volume with differently defined/patterned/tagged cohorts α, β, ε.

A more sophisticated example is depicted in FIGS. 7 and 8. Here, a finite slab thickness for the tag volume is assumed with attention paid both to when spins enter and exit the tag volume. In general, cohorts of nuclei are now the spins that "see" a given set of tags or tag pulses. A double indexing scheme can be used to identify such cohorts, where if a cohort is tagged, the first index gives the span in which the tagging volume is entered, and the second index gives the span in which the tagging volume is exited:

| | |
|---|---|
| Cohort 1, 4 | "sees" tag pulses TA, TB, TC |
| Cohort 2, 4 | "sees" tag pulses TB, TC |
| Cohort 3, 4 | "sees" tag pulse TC |
| Cohort 1, 3 | "sees" tag pulses TA, TB |
| Cohort 2, 3 | "sees" tag pulse TB |
| Cohort 1, 2 | "sees" tag pulse TA |
| Cohort 0 | sees no tag pulses. |

If desired, these cohorts may be defined in terms of "Tag Enter Time" and "Tag Exit Time" as depicted in FIG. 7. In this case, if spins do not reenter the tagging slab after leaving (e.g., they flow in an artery that goes straight through the tagging volume as depicted in FIG. 8 and do not return back to/through it), then one does not need to consider a cohort that "sees" TA and TC, but is insensitive to TB.

The exemplary embodiments provide an MRI technique for imaging blood inflow or tissue perfusion utilizing multiple excitations or MRI data acquisition shots. Each shot excitation has plural possible tagging pre-pulses, each pre-pulse being effective or not (i.e., disabled) in a possibly different predetermined pattern for each shot. The effect of such encoding in each shot is determined for each of several cohorts of spins, and a decoding is performed to detect the amount of MRI signal associated with each cohort.

The effect of a tag may preferably be a substantially 180° inversion of magnetization for some cohorts. The encoding may be further expanded to include compensation for effects of imperfect inversion. The encoding may further include compensation for T1 relaxation (or other signal evolution changes). Distinct images can be created for distinct sets of arrival times, if desired. Distinct images may also be created for distinct tagging times or inversion times, if desired. Tissue perfusion values can also be generated using signal levels associated with multiple tagging times. Decoding can be effected using a pseudo-inverse or least-squares minimization of the associated encoding. Decoding further may also reduce detection of background signal with no tagging effect. Effectiveness of decoding also can be used to optimize or determine which of many possible sets of encodings are preferred. Cohorts of nuclei may be defined or chosen based on flow or motion into and/or out of a tagging spatial volume region, etc.

An interference effect may be presented where spins within a cohort are subjected to more than one tagging pulse or more than one tagging time. This interference effect can be modeled for a cylindrical vessel with laminar flow. The magnitude of this effect is dependent on a few parameters including peak blood velocity and tag volume thickness.

For short delta TI spacing, the interference effect can be quite strong for thick (e.g., 10 cm) tag volumes. But for thin (e.g., 2 cm) tag volumes, the spins are mostly refreshed and there is little interference.

Interference can be caused by "laggard" spins (those starting in the distal portion of the tag volume and/or having lower velocity) being hit more than once with tag pulses in some encoding patterns. It may cause errors in the estimate of the contributions of some cohorts, if insufficient modeling is done of the encoding process. Simpler models which utilize only exit times and only apply single tags per repetition, may either over-count or under-count the spins of some cohorts. Here, the under-counting or over-counting can be called "interference."

Thus, simple application of Hadamard-encoded continuous ASL (H-CASL) may not work in some pulsed ASL applications. One needs to recognize and accommodate this interference effect. Correct identification and measurement of cohorts, as performed in this exemplary embodiment, generally may require multiplexed tagging, including at least some shots where more than one of the temporally distinct tags are applied (or "on") within a single shot. As a method to analyze such effects for a proposed tagging scheme, consider all tagging times, and consider all possible cohorts, keeping each cohort as part of the analysis unless there is a physical reason why that cohort is expected to be insignificant. Generate the encoding matrix. Attempt to generate a decoding matrix. If the system is underdetermined, and there is no good way to solve for the strengths of all significant cohorts, then the tagging schedule is probably insufficient for accurate quantification, and addition of additional distinct lines into the tagging schedule or other alterations to the proposed scheme would be indicated.

There are some physical reasons why pseudo-continuous ASL (pCASL) multiplexed ASL (or H-CASL) may work without running into this interference effect. For example, pCASL multiplexed can work when the pCASL tag volume is thin (~2 cm) relative to the typical pulsed ASL tag volume (~10 cm). This thinness allows flowing nuclei to be nearly completely refreshed between each tagging event. There is thus little to no interference from possible multiple tagging situations.

Perhaps more importantly for pCASL, where a tag pulse is followed immediately by another tag pulse, there is no expected interference. The continuous tagging processing just continues unabated as usual.

Since time-multiplexed pCASL does not have this interference effect, its cohort contributions are estimated to be completely uniform. Note however that the pCASL acquisition may have other disadvantages such as technical difficulty in implementation, degraded performance in the presence of off-resonance, degraded performance in the presence of wide ranges of velocities, or high SAR power deposition into the patient.

These expected interference-caused deviations in the pulsed ASL measured signal can be corrected using a model. Inputs to the model may be velocity (estimated) and tag thickness (known). There would be further modifications for tag-slice separation. The model assumption of a laminar cylindrical vessel would hold for many clinical applications.

The model can assume that results for the non-interference case are the target results. These non-interference results may be the same as pCASL results.

One can calculate a simple correction factor based on simple division. This correction factor can also include T1 relaxation effects or other components (like inversion efficiency) as already mentioned. Overall, there may be multiple ways to correct for this interference effect.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for using a magnetic resonance imaging (MRI) system to produce an image representative of flowing nuclei within a subject, said method comprising:
   (a) for each of plural MRI data acquisition sequences, applying a non-contrast pulsed ASL (arterial spin labeling) pre-sequence to flowing nuclei in a tagging region during a tagging period which occurs prior to MRI data acquisition from a selected downstream image region, said ASL pre-sequence comprising plural different elapsed tagging times at which a radio frequency (RF) nuclear magnetic resonant (NMR) nutation tagging pulse occurs or does not occur in accordance with different predetermined patterns for corresponding different ones of said data acquisition sequences;
   (b) decoding said acquired MRI data in accordance with said predetermined patterns to thereby detect MRI signal emanating from different cohorts of flowing nuclei that have been subjected to different combinations of said nutation pulses; and
   (c) using the acquired MRI data to reconstruct at least one image representing said flowing nuclei within said selected image region.

2. A method as in claim 1, wherein at least some of said cohorts of flowing nuclei have been subjected to plural of said nutation pulses.

3. A method as in claim 2, wherein each of said cohorts of flowing nuclei have been subjected to at least one of said nutation pulses.

4. A method as in claim 1, wherein at least one MRI data acquisition sequence acquires MRI data without any tagging pulse occurrence to acquire MRI data which is used in said decoding process to reduce background MRI signal from non-flowing nuclei within said selected image region.

5. A method as in claim 1, wherein at least some of said NMR nutation pulses substantially invert NMR magnetization for at least some of said cohorts by effecting substantially 180 degrees of NMR nutation.

6. A method as in claim 5, wherein MRI signal emanating from said different cohorts is compensated for expected effects of imperfect inversion.

7. A method as in claim 1, wherein MRI signals emanating from said different cohorts are compensated for respectively different T1 NMR relaxation signal decays occurring due to different respectively associated elapsed times after tagging until MRI data acquisition occurs for different cohorts.

8. A method as in claim 1, wherein an image is generated for each of different flowing nuclei arrival times at said selected image region.

9. A method as in claim 1, wherein an image is generated for each of different flowing nuclei transit times associated with motion with reference to one or more selected regions.

10. A method as in claim 1 wherein an image is generated for each of different tagging times representing different cohorts of flowing nuclei.

11. A method as in claim 1, wherein a blood perfusion value is generated for at least a portion of said selected image region using acquired MRI signal levels associated with a plurality of said tagging times.

12. A method as in claim 1, wherein said encoding is performed in accordance with a predetermined encoding matrix and said decoding is performed in accordance with a decoding matrix which is an inverse version of said encoding matrix.

13. A method as in claim 12, wherein said decoding matrix is a pseudo-inverse or least-squares regression minimization of the encoding matrix.

14. A method as in claim 1, wherein at least one of the following parameters has been optimized based on expected effectiveness of said decoding: (a) nutation magnitudes of said nutation tagging pulses, (b) the magnitudes of said different elapsed times, (c) said predetermined pattern, (d) spatial location of said selected downstream image region, (e) spatial location of said selected ASL tagging region, (f) spatial extent of said selected image region, and (g) spatial extent of said selected ASL tagging region.

15. A non-transitory computer program storage medium containing at least one computer program which, when executed by at least one computer in an MRI system, effects the method of claim 1.

16. An MRI (magnetic resonance imaging) system comprising a static magnet, magnetic gradient coils, at least one RF coil and at least one controlling computer configured to effect:
   (a) for each of plural MRI data acquisition sequences, applying a non-contrast pulsed ASL (arterial spin labeling) pre-sequence to flowing nuclei in a tagging region during a tagging period which occurs prior to MRI data acquisition from a selected downstream image region, said ASL pre-sequence comprising plural different elapsed tagging times at which a radio frequency (RF) nuclear magnetic resonant (NMR) nutation tagging pulse occurs or does not occur in accordance with different predetermined patterns for corresponding different ones of said data acquisition sequences;
   (b) decoding said acquired MRI data in accordance with said predetermined patterns to thereby detect MRI signal emanating from different cohorts of flowing nuclei that have been subjected to different combinations of said nutation pulses; and
   (c) using the acquired MRI data to reconstruct at least one image representing said flowing nuclei within said selected image region.

17. An MRI system as in claim 16, wherein at least one MRI data acquisition sequence acquires MRI data without any tagging pulse occurrence to acquire MRI data which is used in said decoding process to reduce background MRI signal from non-flowing nuclei within said selected image region.

18. An MRI system as in claim 16, wherein MRI signals emanating from said different cohorts are compensated for respectively different T1 NMR relaxation signal decays occurring due to different respectively associated elapsed times after tagging until MRI data acquisition occurs for different cohorts.

19. An MRI system as in claim 16, wherein a blood perfusion value is generated for at least a portion of said selected image region using acquired MRI signal levels associated with a plurality of said tagging times.

20. An MRI system as in claim 16, wherein said encoding is performed in accordance with a predetermined encoding matrix and said decoding is performed in accordance with a decoding matrix which is an inverse version of said encoding matrix.

\* \* \* \* \*